(12) United States Patent
Khoueir et al.

(10) Patent No.: US 7,659,180 B1
(45) Date of Patent: Feb. 9, 2010

(54) METHOD OF REDUCING STEP HEIGHT DIFFERENCE BETWEEN DOPED REGIONS OF FIELD OXIDE IN AN INTEGRATED CIRCUIT

(75) Inventors: Antoine Khoueir, Eagan, MN (US); Maroun Khoury, Eagan, MN (US); Andrey Zagrebelny, Eagan, MN (US)

(73) Assignee: Cypress Semiconductor Corporation, San Jose, CA (US)

( * ) Notice: Subject to any disclaimer, the term of this patent is extended or adjusted under 35 U.S.C. 154(b) by 898 days.

(21) Appl. No.: 10/927,365

(22) Filed: Aug. 26, 2004

Related U.S. Application Data

(60) Provisional application No. 60/504,039, filed on Sep. 19, 2003.

(51) Int. Cl.
 *H01L 21/76* (2006.01)
(52) U.S. Cl. .............. 438/424; 438/196; 438/221; 438/427; 257/E21.54; 257/E21.628
(58) Field of Classification Search .......... 438/231, 438/183, 300, 586, 196, 208, 219, 220, 295, 438/318, 353, 355, 359, 414; 257/E21.574
See application file for complete search history.

(56) References Cited

U.S. PATENT DOCUMENTS

| | | | | |
|---|---|---|---|---|
| 6,124,189 | A * | 9/2000 | Watanabe et al. | 438/586 |
| 6,140,191 | A * | 10/2000 | Gardner et al. | 438/300 |
| 6,235,568 | B1 * | 5/2001 | Murthy et al. | 438/231 |
| 6,524,901 | B1 * | 2/2003 | Trivedi | 438/183 |
| 6,524,904 | B1 * | 2/2003 | Segawa et al. | 438/232 |
| 6,656,764 | B1 * | 12/2003 | Wang et al. | 438/104 |
| 2002/0102775 | A1 * | 8/2002 | Houng et al. | 438/143 |
| 2004/0077171 | A1 * | 4/2004 | Chuang et al. | 438/692 |

OTHER PUBLICATIONS

S. Shishiguchi, et al., "The reduction of grain size in LPCVD poly-Si by in situ oxygen and phosphorus doping" 1996, pp. 689-693, Journal of Crystal Growth.
Kuang-Chao Chen, et al, "Applications of Single-Wafer Rapid-Thermal Processing to the Manufacture of Advanced Flash Memory" May 2003, pp. 128-137, IEEE Transactions on Semiconductor Manufacturing, vol. 16, No. 2.
Pierre C. Pazan, et al., "A Highly Manufacturable Trench Isolation Process for Deep Submicron DRAMs" 1993, pp. 57-60, IEDM, IEEE.
Byung-Jin Cho, et al., "Evaluation of a vertical tube concept for RTP" 1993, pp. 165-169, Mat. Res. Soc. Symp. Proc. vol. 303, Materials Research Society.

* cited by examiner

*Primary Examiner*—Savitri Mulpuri
*Assistant Examiner*—Cheung Lee

(57) ABSTRACT

In one embodiment, a method of fabricating one or more transistors in an integrated circuit includes an annealing step prior to a gate oxidation step. The annealing step may comprise a rapid thermal annealing (RTA) step performed prior to a gate oxidation pre-clean step. Among other advantages, the annealing step reduces a step height difference between P-doped and N-doped regions of a field oxide of a shallow trench isolation structure. The shallow trench isolation structure may be separating a PMOS transistor and an NMOS transistor in the integrated circuit.

14 Claims, 3 Drawing Sheets

METHOD OF REDUCING STEP HEIGHT DIFFERENCE BETWEEN DOPED REGIONS OF FIELD OXIDE IN AN INTEGRATED CIRCUIT

REFERENCE TO RELATED APPLICATION

This application claims the benefit of U.S. Provisional Application No. 60/504,039, entitled "Process For Reducing Isolation Oxide Step Height Delta," filed on Sep. 19, 2003 by Antoine Khoueir, Maroun Khoury, and Andrey Zagrebelny, which is incorporated herein by reference in its entirety.

BACKGROUND OF THE INVENTION

1. Field of the Invention

The present invention relates generally to integrated circuits, and more particularly but not exclusively to integrated circuit fabrication processes and structures.

2. Description of the Background Art

A metal oxide semiconductor field effect transistor (MOSFET) includes a source, a drain, and a gate. The source and the drain are typically formed in a substrate and separated by a channel. In an enhancement-type MOSFET, a channel sufficient to allow current flow between the source and the drain is not formed until the voltage on the gate relative to the source ($v_{gs}$) equals or exceeds the threshold voltage ($V_T$) of the MOSFET. Using complementary metal oxide semiconductor technology (CMOS), two kinds of enhancement-type MOSFETs may be fabricated in the same substrate. The first kind has a P-type channel and is referred to as a "PMOS transistor", while the second kind has an N-type channel and is referred to as an "NMOS transistor." PMOS and NMOS transistors may be separated by a shallow trench isolation (STI) structure.

FIG. 1 shows a schematic diagram of an example integrated circuit 100 in the middle of its fabrication process. FIG. 1 shows a PMOS transistor being formed in an N-well 105 and an NMOS transistor being formed in a P-well 106 after a gate oxidation step. The gate oxidation step formed gate oxides 108 and 109 for the PMOS and NMOS transistors, respectively. An STI structure 102 filled with field oxide (also referred to as "FILOX") separates the PMOS and NMOS transistors. The region of the STI structure 102 overlying P-well 106 has been implanted with a P-type dopant during the formation of P-well 106, while the region of STI structure 102 overlying N-well 105 has been implanted with an N-type dopant during the formation of N-well 105. In FIG. 1, a dotted line 112 marks the division between the P-doped and N-doped regions of STI structure 102. An arrow 103 points towards the N-doped region and an arrow 104 points towards the P-doped region.

A problem with integrated circuit 100 is the difference in step height between the P-doped and N-doped regions of STI structure 102. This step height difference also referred to as "step height delta," is generally bounded by dashed area 107. The step height difference may limit the operational window for a chemical mechanical polishing (CMP) step performed during the fabrication of STI structure 102. The operational window may specify a lower and an upper limit for the step height of the field oxide. In FIG. 1, dimension D110 illustrates a distance between the top and bottom exposed portions of the field oxide, while dimension D111 illustrates a distance between the top of the region where a gate is to be formed (i.e., "gate region") and the bottom exposed portion of the field oxide. The limits for dimensions D110 and D111 may be dictated by the process window of the CMP step. For example, an excessive step height delta may limit the operational window for a silicon nitride CMP step and a silicon nitride strip step. Performing the silicon nitride CMP and silicon nitride strip steps on the upper side of the operational window may result in polystringer defects, while performing the steps on the lower side of the operational window may result in device stand-by current leakage. FIG. 2 shows a scanning electron micrograph (SEM) of an STI structure having an excessive step height delta (see dashed area 202) similar to that shown in FIG. 1.

SUMMARY

In one embodiment, a method of fabricating one or more transistors in an integrated circuit includes an annealing step prior to a gate oxidation step. The annealing step may comprise a rapid thermal annealing (RTA) step performed prior to a gate oxidation pre-clean step. Among other advantages, the annealing step reduces a step height difference between P-doped and N-doped regions of a field oxide of a shallow trench isolation structure. The shallow trench isolation structure may be separating a PMOS transistor and an NMOS transistor in the integrated circuit.

These and other features of the present invention will be readily apparent to persons of ordinary skill in the art upon reading the entirety of this disclosure, which includes the accompanying drawings and claims.

DETAILED DESCRIPTION

In the present disclosure, numerous specific details are provided such as examples of apparatus, process parameters, materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

A conventional process for fabricating transistors of an integrated circuit includes a shallow trench isolation (STI) formation step, channel, core, and well implant steps, a gate oxidation pre-clean step, and a gate oxidation step. The inventors found that the aforementioned conventional process has a tendency to have the aforementioned excessive step height difference between the P-doped and N-doped regions of the STI structure. Without being limited by theory, the inventors believe that this is due to the differential removal rate of the P-doped and N-doped regions during the gate oxidation pre-clean step. The gate oxidation pre-clean step may be a hydrofluoric (HF) acid wet clean step performed after the channel and well implant steps, but before forming the gate oxide.

In one embodiment, a rapid thermal annealing (RTA) step is performed before the gate oxidation pre-clean step to reduce the step height difference. Without being limited by theory, the inventors believe that the RTA step changes the surface properties of the field oxide of the STI structure, making the field oxide less susceptible to subsequent gate oxidation pre-cleans. That is, the inventors believe that the RTA step restores the surface properties of the field oxide that were damaged during implant steps. In one embodiment where the field oxide comprises a high-density plasma (HDP) silicon dioxide, the RTA step is performed at about 700° C. for about 2 minutes.

Figure 1:
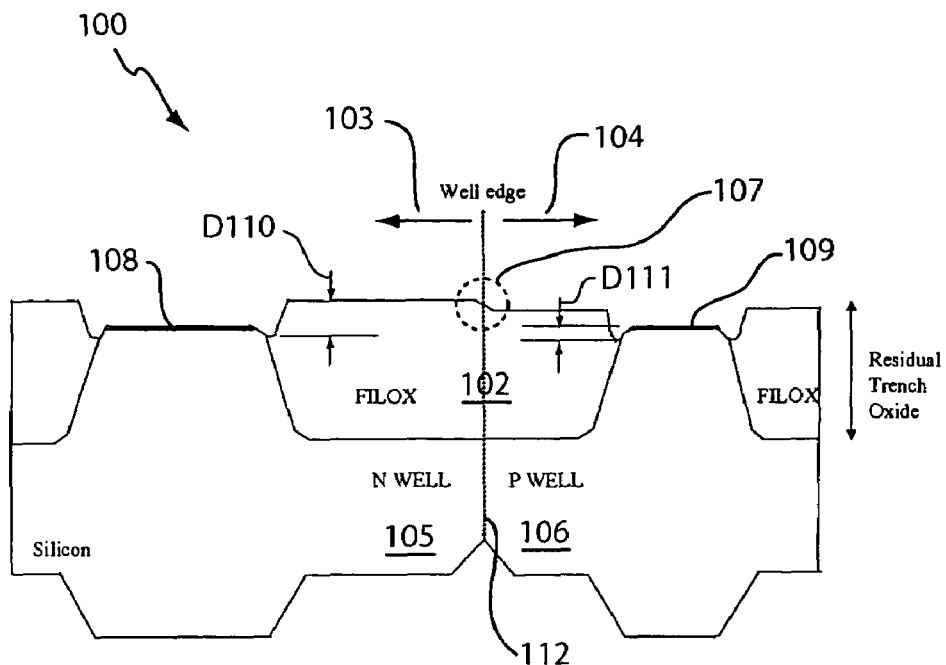
FIG. 1 shows a schematic diagram of an example integrated circuit in the middle of its fabrication process.
Figure 2:
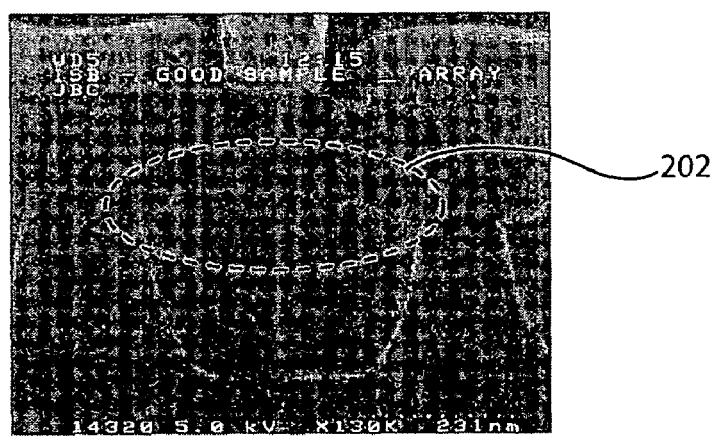
FIG. 2 shows a scanning electron micrograph of an STI structure having an excessive step height delta similar to that shown in FIG. 1.
Figure 3:
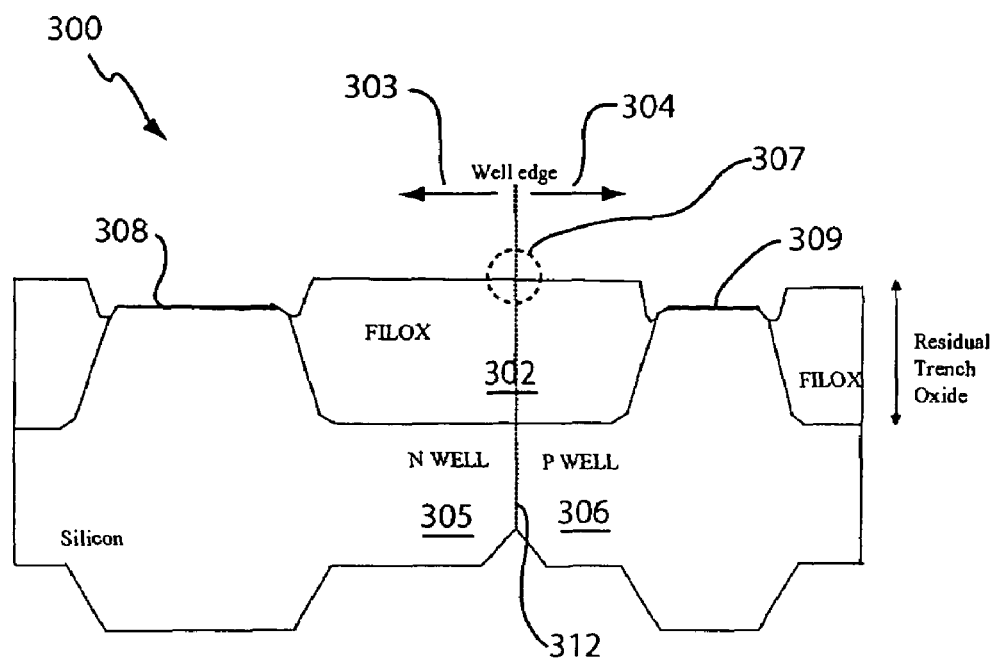
FIG. 3 shows a schematic diagram of an integrated circuit in the middle of its fabrication process, in accordance with an embodiment of the present invention.
Figure 4:
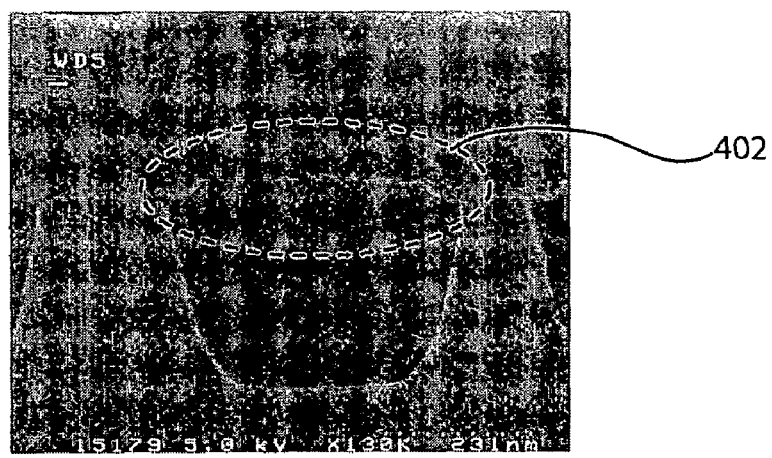
FIG. 4 shows a scanning electron micrograph of an STI structure in accordance with an embodiment of the present invention.

FIG. 3 shows a schematic diagram of integrated circuit 300 in the middle of its fabrication process, in accordance with an embodiment of the present invention. In the example of FIG. 3, a PMOS transistor is being formed in an N-well 305 and an NMOS transistor is being formed in a P-well 306 after a gate oxidation step. The gate oxidation step formed gate oxides 308 and 309 of the PMOS and NMOS transistors, respectively. An STI structure 302 filled with field oxide separates the PMOS and NMOS transistors. In one embodiment, the field oxide comprises silicon dioxide deposited by high-density plasma chemical vapor deposition (HDP-CVD). The region of STI structure 302 overlying P-well 306 has been implanted with a P-type dopant during the formation of P-well 306, while the region of STI structure 302 overlying N-well 305 has been implanted with an N-type dopant during the formation of N-well 305. In FIG. 4, a dotted line 312 marks the division between the P-doped and N-doped regions of STI structure 302. An arrow 303 points towards the N-doped region and an arrow 304 points towards the P-doped region.

In the example of FIG. 3, an RTA step was performed before the gate oxidation pre-clean step. This results in a reduced step height difference (see dashed area 307) between the P-doped and N-doped regions of STI structure 302. The reduced step height difference advantageously widens the operational window for the chemical mechanical polishing step performed in the formation of STI structure 302. This is because the planarity of the field oxide after the chemical mechanical polishing step is no longer appreciably changed by a subsequently performed gate oxidation pre-clean step. FIG. 4 shows a scanning electron micrograph (SEM) of an STI structure having a reduced step height delta (see dashed area 402) similar to that shown in FIG. 3.

Figure 5:
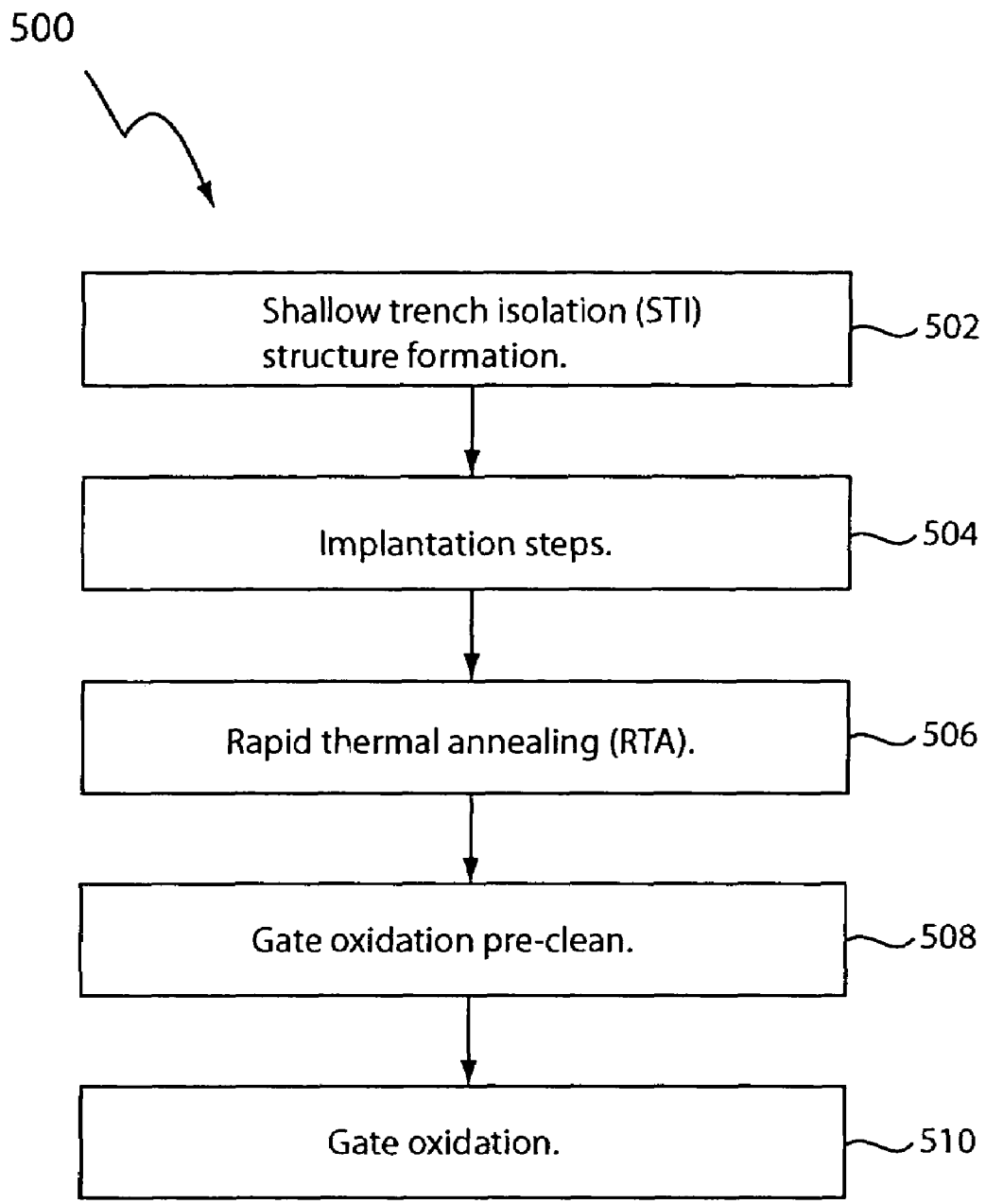
FIG. 5 shows a flow diagram of a method of fabricating one or more transistors of an integrated circuit in accordance with an embodiment of the present invention.

FIG. 5 shows a method 500 of fabricating one or more transistors of an integrated circuit in accordance with an embodiment of the present invention. Method 500 may be employed to arrive at the integrated circuit structure shown in FIG. 3. Referring to FIG. 5, in step 502, a shallow trench isolation (STI) structure (e.g., STI structure 302) is formed. The STI structure may be formed in a silicon substrate, for example. The STI structure may isolate a PMOS transistor and an NMOS transistor being formed in the same substrate. As is well known, an STI structure may be formed by digging a trench in the substrate, filling the trench with field oxide, and then planarizing the field oxide by chemical mechanical polishing (CMP). In one embodiment, the field oxide comprises silicon dioxide deposited by HDP-CVD.

In step 504, channel, core, and well implant steps are performed on the substrate. Step 504 results at least in the formation of an N-well (e.g., N-well 305) for the PMOS transistor and a P-well (e.g., P-well 306) for the NMOS transistor.

In step 506, the substrate is subjected to an annealing step. In one embodiment, the annealing step comprises rapid thermal annealing (RTA). Preferably, the RTA is performed such that the step height difference between P-doped and N-doped regions of the STI structure is minimized without substantially changing basic transistor characteristics, such as threshold voltage and saturation drive current. In one embodiment, the RTA is performed at about 700° C. for about 2 minutes. Depending on process details, further reduction in step height difference may be achieved by increasing the RTA temperature. However, at higher temperatures (e.g. 800° C. for 2 minutes), the RTA may adversely affect transistor characteristics. As can be appreciated, the RTA temperature and duration may be tailored to meet specific process requirements without detracting from the merits of the present invention.

In step 508, a gate oxidation pre-clean step is performed to prepare the surfaces of regions where a gate is to be formed (e.g., region under gate oxides 308 and 309). The gate oxidation pre-clean step may comprise a hydrofluoric (HF) acid wet clean step. Preferably, the gate oxidation pre-clean step is performed after the implantation steps (see step 504) but before the gate oxidation step (see step 510). The RTA step is advantageously performed before the gate-oxidation pre-clean step to minimize step height difference between the P-doped and N-doped regions of the STI structure.

In step 510, gate oxides (e.g., gate oxides 308 and 309) are formed on regions where a gate is to be formed. Conventional processing steps may then be performed to complete the fabrication of the PMOS and NMOS transistors.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating a transistor comprising:
   forming a shallow trench isolation (STI) structure in a substrate, the STI comprising a P-doped region adjacent to an N-doped region, the P-doped region comprising a step-height difference from the N-doped region;
   prior to forming a gate oxide over a gate region where a gate is to be formed, annealing the substrate, wherein the annealing reduces the step-height difference; and
   forming the gate oxide prior to forming a metal layer that contacts a diffusion region of the transistor.

2. The method of claim 1 wherein the substrate is annealed by rapid thermal annealing.

3. The method of claim 2 wherein the rapid thermal annealing is performed at a temperature of about 700° C. for about 2 minutes.

4. The method of claim 1 wherein the substrate is annealed prior to performing a gate oxide pre-clean on a surface over the gate region, the gate oxide pre-clean being performed prior to forming the gate oxide.

5. The method of claim 1 wherein the STI structure isolates an NMOS transistor region and a PMOS transistor region.

6. The method of claim 1 wherein the substrate comprises silicon.

7. The method of claim 1 wherein the substrate is annealed by rapid thermal annealing prior to cleaning a surface of the gate region with hydrofluoric acid.

8. The method of claim 1 wherein the STI structure is filled with silicon dioxide deposited by high density plasma chemical vapor deposition (HDP-CVD).

9. A method of fabricating a transistor, the method comprising:

forming an isolation structure in a substrate, the isolation structure separating a PMOS transistor region and an NMOS transistor region;

implanting a P-type dopant in the substrate to form a P-well in the NMOS transistor region and to form a P-doped region of the isolation region;

implanting an N-type dopant in the substrate to form an N-well in the PMOS transistor region and to form an N-doped region of the isolation structure, the P-doped region comprising a step-height difference from the N-doped region;

subjecting the substrate to rapid thermal annealing prior to cleaning a surface of the substrate in preparation to forming a gate oxide, wherein the annealing reduces the step-height difference; and forming the gate oxide prior to forming a metal layer that contacts a diffusion region of the transistor.

10. The method of claim 9 further comprising:
forming the gate oxide over a surface of the substrate where a gate is to be formed.

11. The method of claim 9 wherein the rapid thermal annealing is performed for about two minutes at about 700° C.

12. The method of claim 9 wherein the isolation structure is filled with silicon dioxide deposited by high density plasma chemical vapor deposition (HDP-CVD).

13. The method of claim 9 wherein the substrate comprises silicon.

14. The method of claim 9 wherein the isolation structure comprises a shallow trench isolation (STI) structure.

* * * * *